(12) United States Patent
Blythe et al.

(10) Patent No.: US 12,557,628 B2
(45) Date of Patent: Feb. 17, 2026

(54) ORGANIC FILM STRESS BUFFER FOR INTERFACE OF METAL AND DIELECTRIC

(71) Applicant: Intel Corporation, Santa Clara, CA (US)

(72) Inventors: Sarah Blythe, Phoenix, AZ (US); Jieying Kong, Chandler, AZ (US); Peumie Abeyratne Kuragama, Chandler, AZ (US); Hongxia Feng, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 998 days.

(21) Appl. No.: 17/485,375

(22) Filed: Sep. 25, 2021

(65) Prior Publication Data
US 2023/0098501 A1    Mar. 30, 2023

(51) Int. Cl.
*H01L 23/522* (2006.01)
*H01L 23/00* (2006.01)
*H01L 23/532* (2006.01)

(52) U.S. Cl.
CPC ...... *H01L 23/5226* (2013.01); *H01L 23/5329* (2013.01); *H01L 24/05* (2013.01); *H01L 2224/02215* (2013.01); *H01L 2224/05647* (2013.01)

(58) Field of Classification Search
CPC . H01L 23/5226; H01L 23/5329; H01L 24/05; H01L 2224/02215; H01L 2224/05647; H01L 23/53295
See application file for complete search history.

(56) References Cited

U.S. PATENT DOCUMENTS

| | | | |
|---|---|---|---|
| 10,378,299 B2 | 8/2019 | Sabins et al. | |
| 2008/0081459 A1* | 4/2008 | Lee | H01L 24/05 438/624 |
| 2009/0076198 A1 | 3/2009 | Giesenberg et al. | |
| 2014/0264822 A1 | 9/2014 | Horikiri et al. | |
| 2019/0279935 A1* | 9/2019 | Unruh, Jr. | H01L 25/0655 |

* cited by examiner

*Primary Examiner* — Patricia D Valenzuela
(74) *Attorney, Agent, or Firm* — Compass IP Law PC

(57) ABSTRACT

A system includes a metallic contact integrated onto a semiconductor integrated circuit substrate with a stress buffer dielectric between the contact and the bulk dielectric. The bulk dielectric typically covers an integrated circuit metal layer to provide electrical isolation of the circuitry. The semiconductor circuit can include a trace that connects the contact to a package pad to enable external access to the signal from off the semiconductor circuit. The stress buffer dielectric has higher elongation and lower filler loading relative to the bulk dielectric, which makes the stress buffer more pliable. The stress buffer is disposed between the contact and the bulk dielectric to improve stress response, reducing the possibility of delamination of the contact from the bulk dielectric.

16 Claims, 11 Drawing Sheets

ORGANIC FILM STRESS BUFFER FOR INTERFACE OF METAL AND DIELECTRIC

FIELD

Descriptions are generally related to computer systems, and more particular descriptions are related to semiconductor layers of integrated circuits.

BACKGROUND

Integrated circuit substrates have metal contacts for electrical routing, which are commonly made of copper. Integrated circuit substrates include a coated layer of bulk dielectric to provide electrical isolation of the circuit. The bulk dielectric is designed to have particular dielectric properties to provide the electrical isolation, and particular mechanical properties such as modulus to ensure a solid cover layer.

During package reliability testing, entire integrated circuit packages are subject to mechanical stress cycling to test the mechanical integrity of the package, and to thermal cycling to test the reliability of the package under thermal expansion and contraction condition. Combinations of thermal and mechanical testing apply stress to the integrated circuits. The metal to dielectric interface is traditionally a weak point in testing due to stress build up between the dissimilar materials of the metal and dielectric, which have different malleability and different thermal expansion properties. Package design rules tend to increase the stress in the metal to dielectric interface.

Common failures in reliability testing include interfacial or near-interfacial delamination between the metal and dielectric. The delamination can result from the build-up of stress at the dielectric to metal interface. The delamination affects the electrical properties of the circuit and can cause poor electric connection to package traces.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION

As described herein, a system includes a metallic contact integrated onto a semiconductor circuit with a stress buffer dielectric between the contact and the bulk dielectric. The bulk dielectric typically covers a metal layer on an integrated circuit substrate to provide electrical isolation between layers of the circuitry. The stress buffer layer introduces new material interfaces in the circuit that can reduce the stresses. Proper engineering of the stress layer material can maintain desirable electrical properties while improving the mechanical properties at the interface with the metal contact (e.g., a copper contact, copper pad, or copper trace).

With the inclusion of the stress buffer layer, the metal does not interface directly with the bulk dielectric, but instead there is a metal to stress buffer interface and a stress buffer to bulk dielectric interface. By engineering the stress buffer dielectric to have higher elongation and lower filler loading relative to the bulk dielectric, the stress buffer is more pliable than traditional bulk dielectric, improving the mechanical properties of the interface with the metal contact. By engineering the stress buffer to have similar electrical properties as the bulk dielectric, there is no loss of electrical isolation or degradation of other desired electrical properties.

In one example, the stress buffer layer is an organic thin film layer. In one example, the organic film layer is a dry film layer. In one example, the organic film layer is a coated film layer. An organic thin film refers to a layer of material that contains organic compounds and only non-metallic compounds. For example, a ceramic compound such as silicon nitride is typically very thin, and while it can improve the mechanical properties of the metal interface when made thicker, the material has suboptimal dielectric properties. Very thin film (nanometer length scale) organic adhesion materials suffer similar drawbacks as the silicon nitride.

Another factor in the delamination of the metal is poor adhesion of the dielectric to the metal. The metal can be roughened to improve adhesion, but roughening the metal contact increases insertion loss. The stress buffer can promote adhesion between the bulk dielectric and the low roughness metal. The application of the stress buffer can allow the circuit to maintain good adhesion of low roughness metal with the bulk dielectric. An organic thin film layer with dielectric properties similar to the bulk dielectric can provide good dielectric properties as a second dielectric material, while acting as a stress buffer between the metal and the dielectric to promote adhesion and absorb stress around the via or trace to reduce the likelihood of failure due to delamination.

Figure 1:
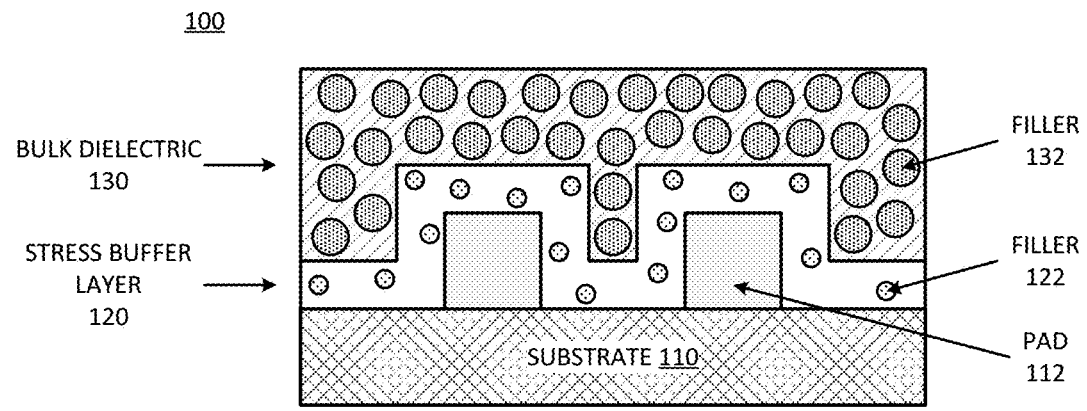
FIG. 1 is a block diagram of an example of an integrated circuit substrate with a stress buffer layer.

FIG. 1 is a block diagram of an example of an integrated circuit substrate with a stress buffer layer. Circuit 100 represents an integrated circuit with a metal pad having two dielectric layers over it: a stress buffer layer and a bulk dielectric.

Substrate 110 represents a semiconductor substrate on which pad 112 is formed. In one example, substrate 110 represents an integrated circuit, with integrated circuitry to perform one or more functions. For example, the integrated circuit could be a processor die or a memory die. Pad 112 can provide an electrical connection to one or more components of the circuitry of substrate 110. In one example, pad 112 is copper metal. Other metals such as titanium, aluminum, nickel, or other metal.

Stress buffer layer 120 represents an organic film. In one example, stress buffer layer 120 can be referred to as a dielectric adhesive or dielectric adhesion layer. In one example, stress buffer layer 120 is an organic stress buffer film such as an epoxy, polyimide, maleimide, or other material as an organic stress buffer dielectric. In one example, stress buffer layer 120 is engineered with a unique chemistry to provide good adhesion to low roughness copper. In one example, stress buffer layer 120 has a CTE (coefficient of thermal expansion) closer to that of pad 112 than bulk dielectric 130.

Bulk dielectric 130 represents a bulk dielectric to cover circuit 100. In one example, the bulk dielectric is an ABF (Ajinomoto build-up film) layer, or other bulk organic dielectric. The bulk dielectric could be silicon dioxide or other oxide layer that has good electrical isolation properties and can provide a relatively high thickness. Between bulk dielectric 130 and pad 112 is stress buffer layer 120. Thus, after pad 112 is formed, the circuit can be coated in stress buffer layer 120, and then a thicker bulk dielectric can be applied.

In one example, stress buffer layer 120 is much thinner than bulk dielectric 130. In one example, bulk dielectric 130 and stress buffer layer 120 are distinguishable in filler content and size. Filler 122 represents the filler for stress buffer layer, and filler 132 represent the filler for bulk dielectric 130. A filler refers to a material in the dielectric that has crystalline properties, such as a ceramic powder or semiconductor material such as silicon. The filler can adjust the dielectric properties of the bulk dielectric and adjust the pliability or the malleability of the material. The filler loading refers to a density or percentage of filler in the dielectric material.

In one example, bulk dielectric 130 has a much higher filler loading than stress buffer layer 120 (e.g., <40% or fillerless, as compared to approximately 70% filler for bulk dielectric 130). While not necessarily to scale, circuit 100 represents bulk dielectric 130 as having a high concentration of filler 132, compared to a relatively low concentration of filler 122 in stress buffer layer 120. While also not necessarily to scale, circuit 100 represents filler 132 of bulk dielectric 130 as being larger in size as well as having a higher content of filler. In one example, filler 122 has a smaller size and lower content of filler in stress buffer layer 120. In one example, stress buffer layer 120 is nano-filled with filler 122, having a relatively small amount of very small filler particles.

While having different mechanical properties, stress buffer layer 120 can be engineered to have a similar df/dk (ratio of dielectric loss factor (df) to dielectric constant (dk)) as bulk dielectric 130. In one example, both stress buffer layer 120 and bulk dielectric 130 have a low df/dk. In one example, the df/dk of stress buffer layer 120 and bulk dielectric 130 are substantially equal. In one example, stress buffer layer 120 has a higher elongation and lower modulus relative to bulk dielectric 130.

Elongation and modulus refer to properties of the material relative to flexibility, to withstand curing deformation and mechanical stress. In one example, stress buffer layer 120 has an elongation of approximately 10-50% relative to approximately 2% for bulk dielectric 130, and a lower modulus (e.g., in single digits or approximately 0.5 to 1.5 for stress buffer layer 120 as compared to approximately 10 or low double digits for bulk dielectric 130). The high elongation and low modulus enable stress buffer layer 120 to withstand the interfacial stress that can be applied to circuit 100.

Figure 2:
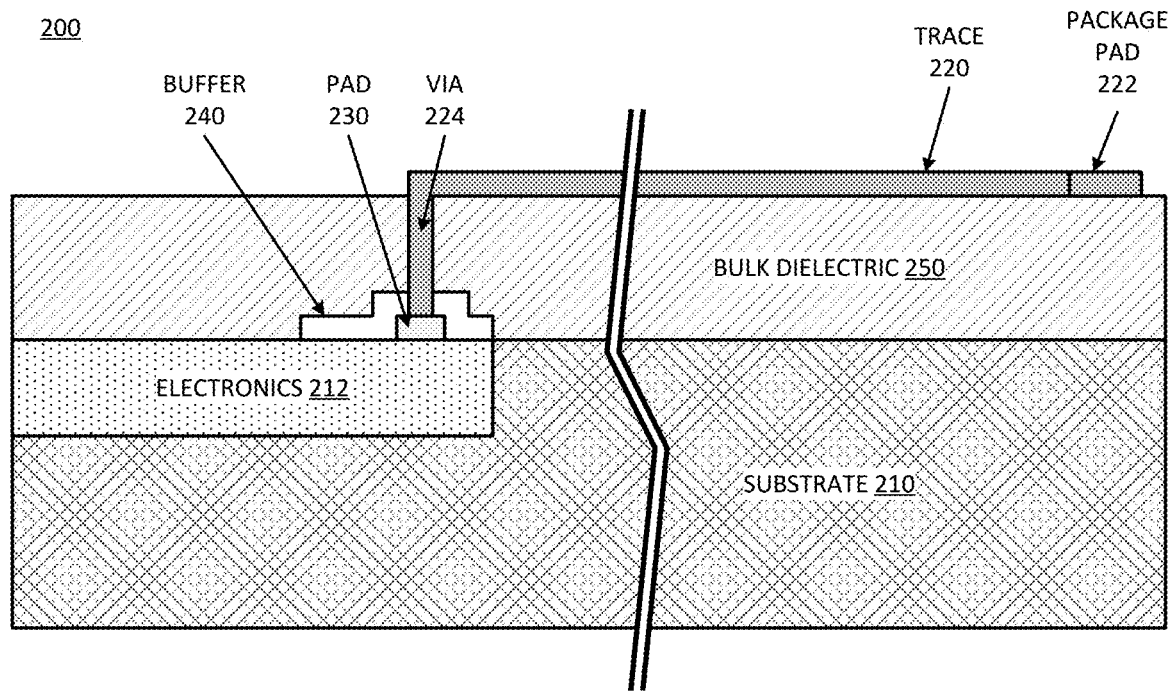
FIG. 2 is a block diagram of an example of an integrated circuit substrate with a metallic contact connected with a package pad.

FIG. 2 is a block diagram of an example of an integrated circuit substrate with a metallic contact connected with a package pad. Circuit 200 represents an integrated circuit in accordance with an example of circuit 100. Circuit 200 provides additional circuit context. The component of circuit 200 are not necessarily to scale and does not necessarily show all components.

Circuit 200 represents an electronic assembly that includes substrate 210, which represents a semiconductor substrate that forms the basis of an integrated circuit die. Electronics 212 represent integrated circuit components integrated into substrate 210. Electronics 212 include one or more components that provide signals or receive signals, or both provide signals and receive signals, from an external source. For example, the connection can be for HSIO (high speed input/output).

Pad 230 represents a connection point for the signal exchange with package pad 222 through trace 220. Package pad 222 represents a pad or contact for connection of the die of substrate 210 to a package, whether for flip chip bonding or wire bonding. Trace 220 represents a metal (such as copper) to transmit the signal between package pad 222 and pad 230, to electronics 212. Trace 220 is electrically connected to pad 230.

Circuit 200 includes buffer 240 over pad 230. Buffer 240 represents an organic stress buffer in accordance with any example herein. In one example, buffer 240 is another layer under all of bulk dielectric 250, whether or not there are electronics 212 or pads 230. In circuit 200, buffer 240 is illustrated as being over pad 230, but is not necessarily over all of electronics 212. In one example, buffer 240 is over all of electronics 212.

As illustrated in the cross section of circuit 200, trace 220 connects to package pad 222 over bulk dielectric 250, and connects to pad 230 through via 224. Via 224 passes vertically through bulk dielectric 250 and buffer 240 to make electrical contact with pad 230. Buffer 240 can reduce warpage in the interface area between pad 230 and the dielectric. Buffer 240 can decrease the risk of interfacial delamination between pad 230 and bulk dielectric 250 and between trace 220 and bulk dielectric 250 at the interconnection with pad 230.

In one example, buffer 240 is permanent film dielectric stress buffer applied on a smooth copper trace by either dry film lamination (e.g., 5-10 um (micron) thickness to enable it to absorb stress, as compared to nm (nanometer) thickness of organic thin films adhesion layers) or coating. In one example, buffer 240 has good adhesive properties to adhere to the metal of pad 230. Buffer 240 has dielectric or electrical properties comparable to bulk dielectric 250.

In one example, buffer 240 is deposited as a blanket film. In one example, buffer 240 is deposited as a lithographically patternable film. Bulk dielectric 250 can represent a traditional bulk dielectric material applied with desired bulk properties (e.g., low CTE, low df/dk). In one example, buffer 240 is drilled or patterned to enable interconnect to trace 220, while mitigating stress between bulk dielectric 250 and the metal.

Figure 3A:
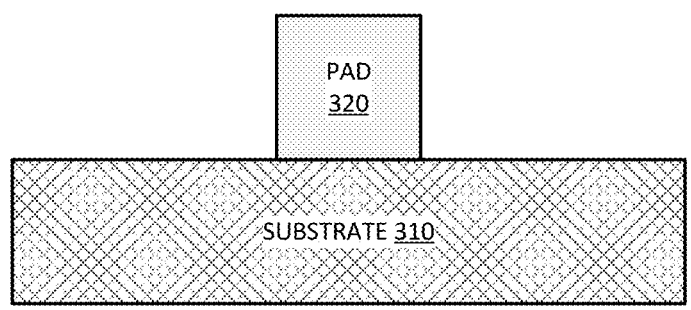
FIGS. 3A-3D represent stages in the creation of an integrated circuit with a stress buffer layer.

FIGS. 3A-3D represent stages in the creation of an integrated circuit with a stress buffer layer. FIG. 3A illustrates circuit state 302, with pad 320 formed on substrate 310. In one example, substrate 310 represents an electronic circuit. Pad 320 represents a metal contact on substrate 310, such as a copper pad.

Figure 3B:
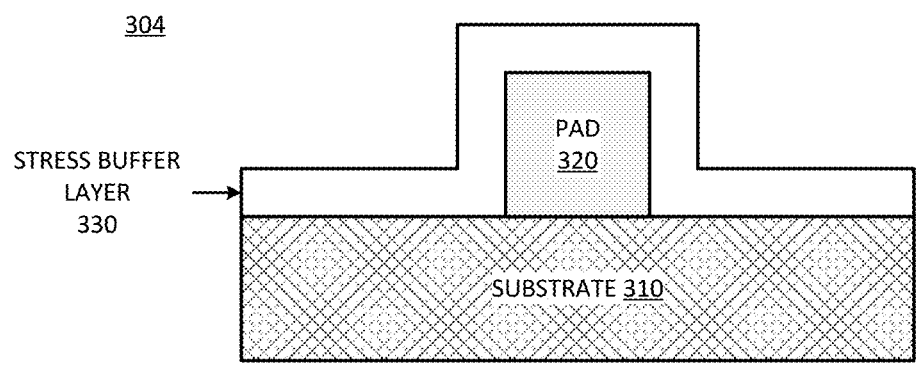

FIG. 3B illustrates circuit state 304, with stress buffer layer 330 formed over pad 320 and substrate 310. In one example, stress buffer layer 330 is formed by spray coating material. The spray coating can occur in multiple passes to layer the material to the desired thickness. Stress buffer layer 330 can be a buffer layer in accordance with any example described herein.

Figure 3C:
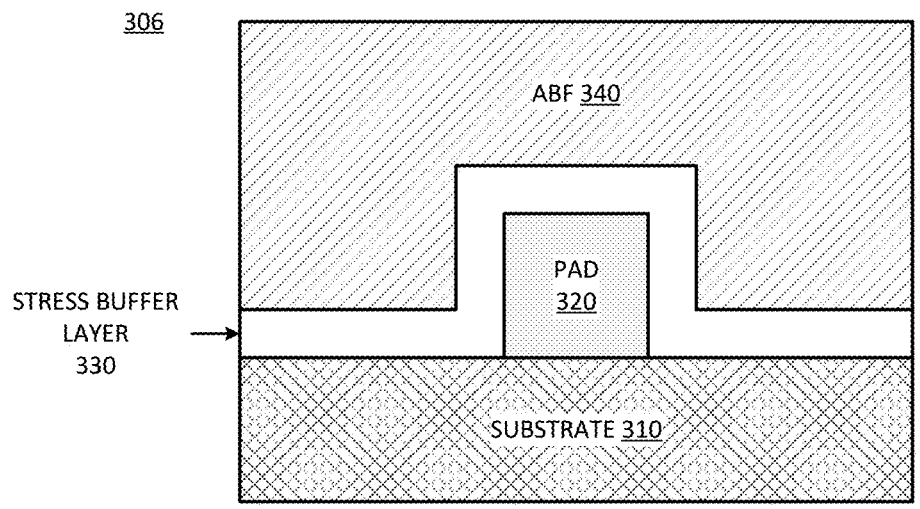

FIG. 3C illustrates circuit state 306, with a bulk dielectric formed over stress buffer layer 330. The bulk dielectric is specifically illustrated as ABF 340. It will be understood that other dielectric materials can be used as the bulk dielectric. ABF 340 can be laminated onto the circuit.

Figure 3D:
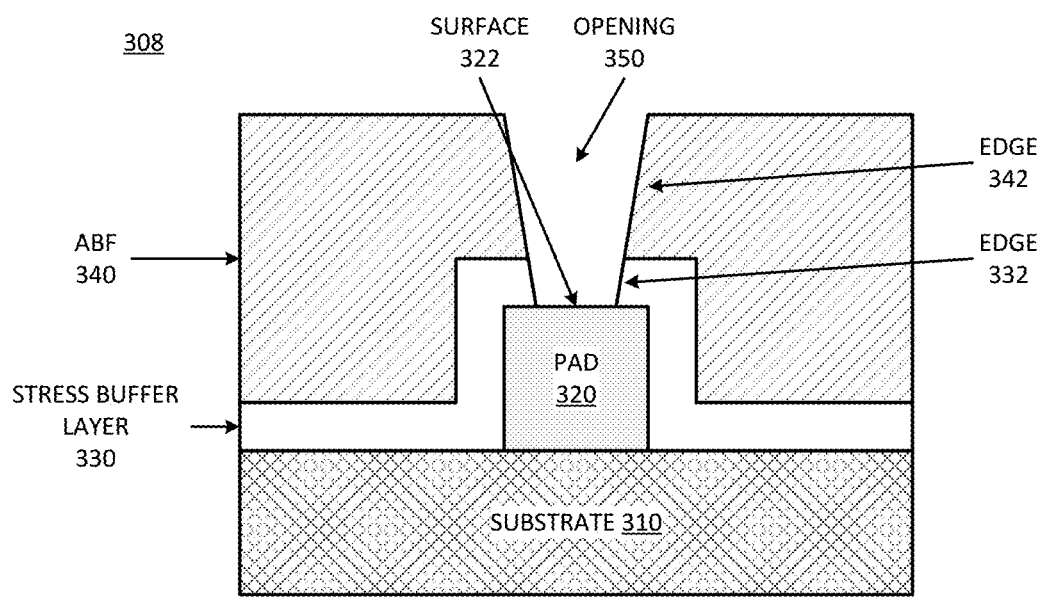

FIG. 3D illustrates circuit state 308, with opening 350, which represents a via to expose a surface of pad 320. In one example, opening 350 is formed through laser drilling. In the example of circuit state 308, opening 350 is formed through ABF 340 and through stress buffer layer 330. Thus, the laser drilling exposes edge 342 of ABF 340 and edge 332 of stress buffer layer 330. Edge 342 and edge 332 can be referred to as vertical edges or vertical walls of the via. Opening 350 exposes surface 322, which can be referred to as a top surface of pad 320 or a surface opposite the surface of the pad in contact with substrate 310. Circuit state 308 can expose a smooth surface of pad 320.

Figure 4:
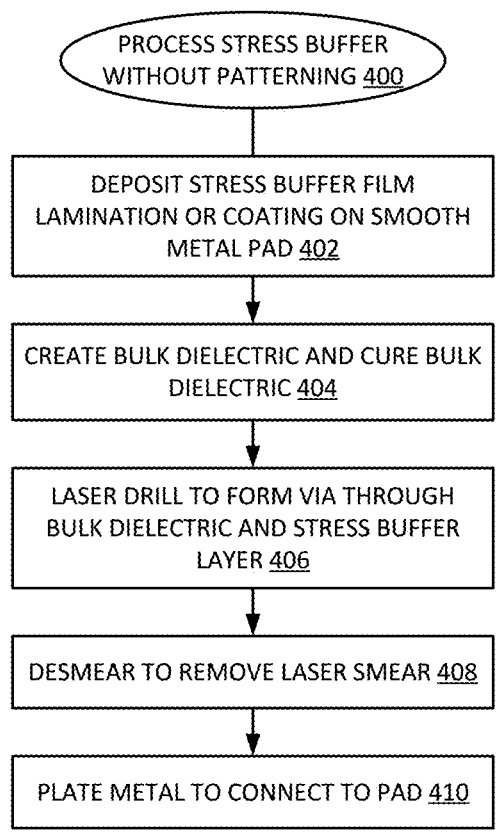
FIG. 4 is a flow diagram of an example of a process for creating an integrated circuit with a stress buffer layer.

FIG. 4 is a flow diagram of an example of a process for creating an integrated circuit with a stress buffer layer. Process 400 represents a process for creating a stress buffer without patterning in the stress buffer. Process 400 can represent operations of circuit processing in accordance with FIGS. 3A-3D.

In one example, the processing deposits a stress buffer film lamination or coating on a smooth metal pad, at 402. The processing can create a bulk dielectric over the stress buffer film dielectric lamination and cure the bulk dielectric, at 404. In one example, the processing performs a laser drill operation to form a via through the bulk dielectric and through the stress buffer layer, at 406. The laser drilling drills through the stress buffer layer because it is not patterned to expose the surface of the metal pad. The laser drilling exposes a smooth surface of the metal pad. The processing can desmear to remove laser smear, at 408. The processing can finish the stress buffer processing by plating metal to connect to the pad, at 410. In one example, the plating refers to electroless copper plating to deposit an even layer of metal on the circuit.

FIGS. 5A-5F represent stages in the creation of an integrated circuit with a stress buffer layer with roughened pad metal. The different circuit states illustrate a patternable stress buffer layer. In one example, the patternable stress buffer layer can be patterned to allow selective copper roughening.

Figure 5A:
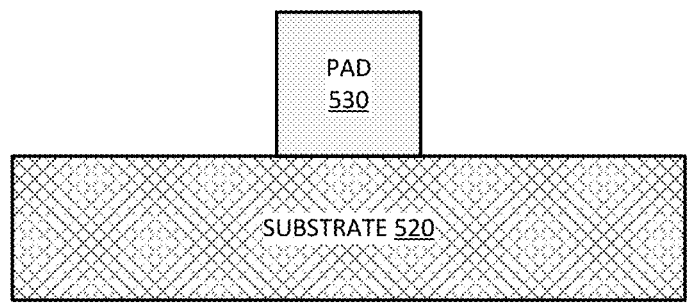
FIGS. 5A-5F represent stages in the creation of an integrated circuit with a stress buffer layer with roughened pad metal.

FIG. 5A illustrates circuit state 502, with pad 530 formed on substrate 520. In one example, substrate 520 represents an electronic circuit. Pad 530 represents a metal contact on substrate 520, such as a copper pad.

Figure 5B:
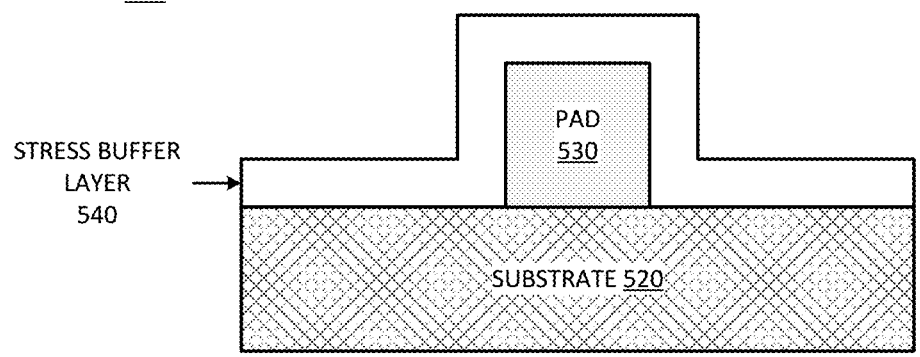

FIG. 5B illustrates circuit state 504, with stress buffer layer 540 formed over pad 530 and substrate 520. In one example, stress buffer layer 540 is formed by spray coating material. The spray coating can occur in multiple passes to layer the material to the desired thickness. In one example, stress buffer layer 540 represents lamination or coating of an adhesive layer on pad 530. Stress buffer layer 540 can be a buffer layer in accordance with any example described herein.

Figure 5C:
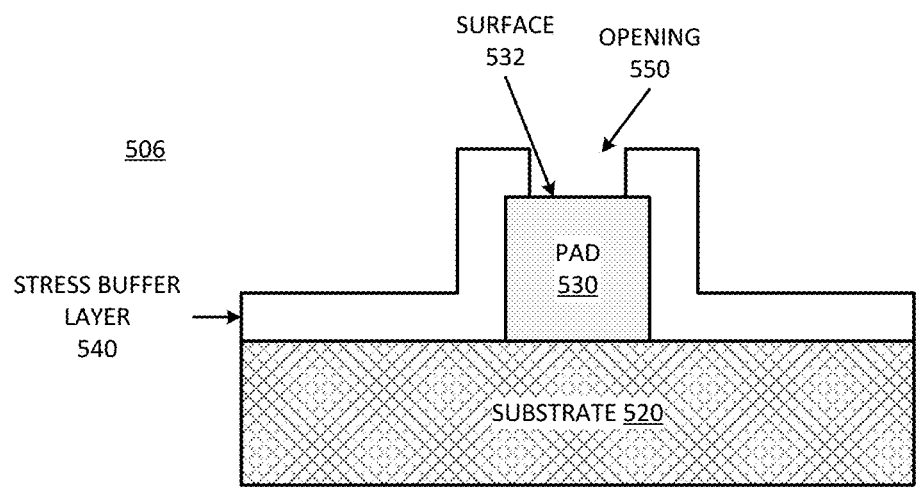

FIG. 5C illustrates circuit state 506, with opening 550 formed in stress buffer layer 540 over pad 530, to expose surface 532. In circuit state 506, the processing can pattern the adhesive layer of stress buffer layer 540. The patterning can include exposure, develop, and strip operations. The patterning can include etching as the stripping to remove the selected portions of stress buffer layer 540. The patterning refers to a process that exposes a selected portion of pad 530 through stress buffer layer 540, such as etched patterns in the stress buffer layer.

Figure 5D:
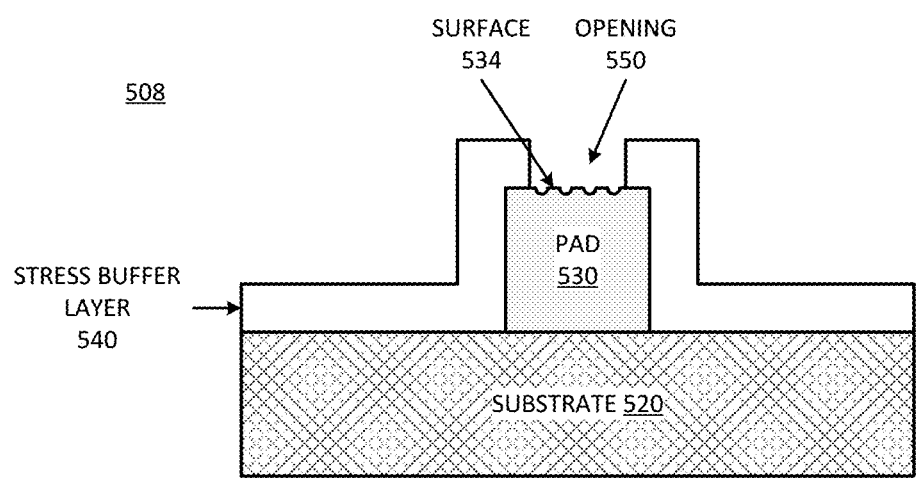
Figure 5E:
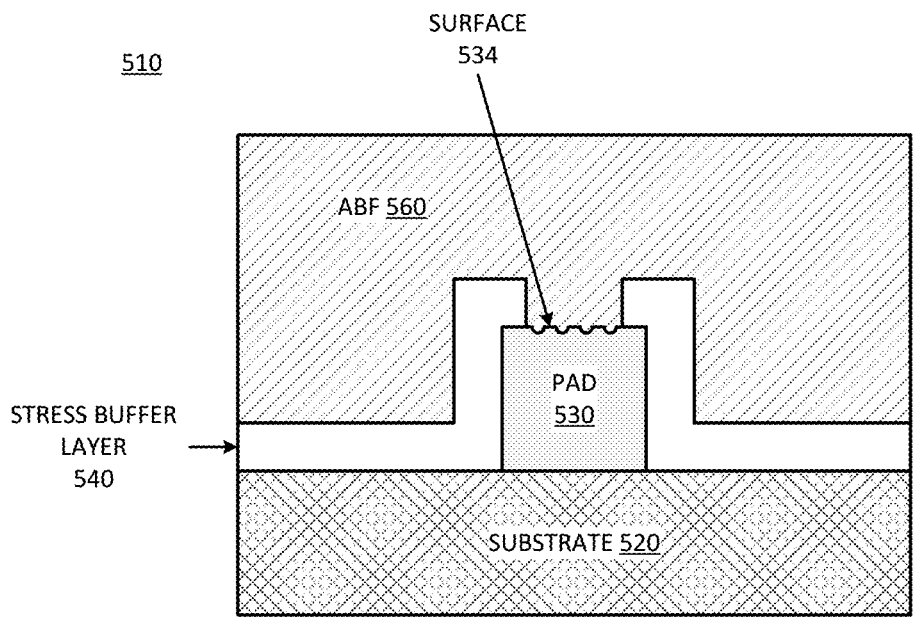
Figure 5F:
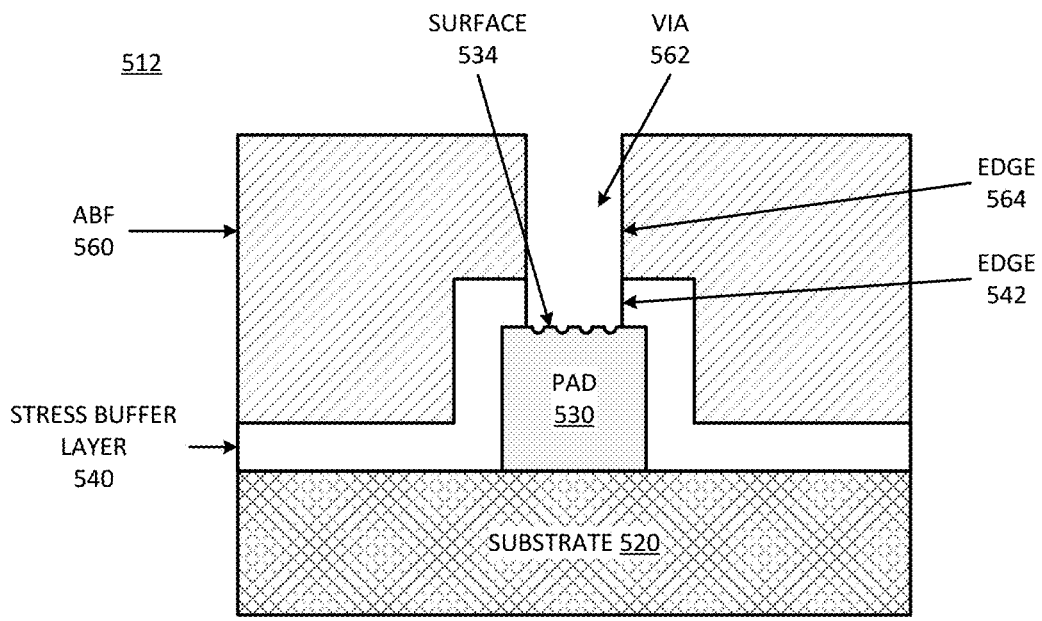

FIG. 5D illustrates circuit state 508, with the exposed surface roughened. The bulk dielectric adheres to stress buffer layer 540, but may not adhere well to smooth metal. Optionally roughening the surface of pad 530 can provide improves adhesion of the bulk dielectric. Roughening only a selected portion of the pad, and a surface that can be plated with metal later can minimize insertion loss due to roughening. Surface 534 represents the exposed, roughened surface of pad 530 or the surface of pad 530 exposed through the stress buffer dielectric.

Figure SE illustrates circuit state 510, with a bulk dielectric formed over stress buffer layer 540 and over the exposed surface 534. The bulk dielectric is specifically illustrated as ABF 560. It will be understood that other dielectric materials can be used as the bulk dielectric. ABF 560 can be laminated onto the circuit.

Figure SF illustrates circuit state 512, with via 562, which represents a via or opening to expose surface 534 of pad 530. In one example, via 562 is formed through laser drilling. In the example of circuit state 512, via 562 is formed through ABF 560, which exposes surface 534 that was already exposed through the patterning of stress buffer layer 540. Thus, the laser drilling exposes edge 564 of ABF 560 and edge 542 of stress buffer layer 540. Edge 542 and edge 564 can be referred to as vertical edges or vertical walls of the via. Via 562 exposes surface 534, which can be referred to as a top surface of pad 530 or a surface opposite the surface of the pad in contact with substrate 520. Circuit state 512 can expose the roughened surface of pad 530.

Figure 6:
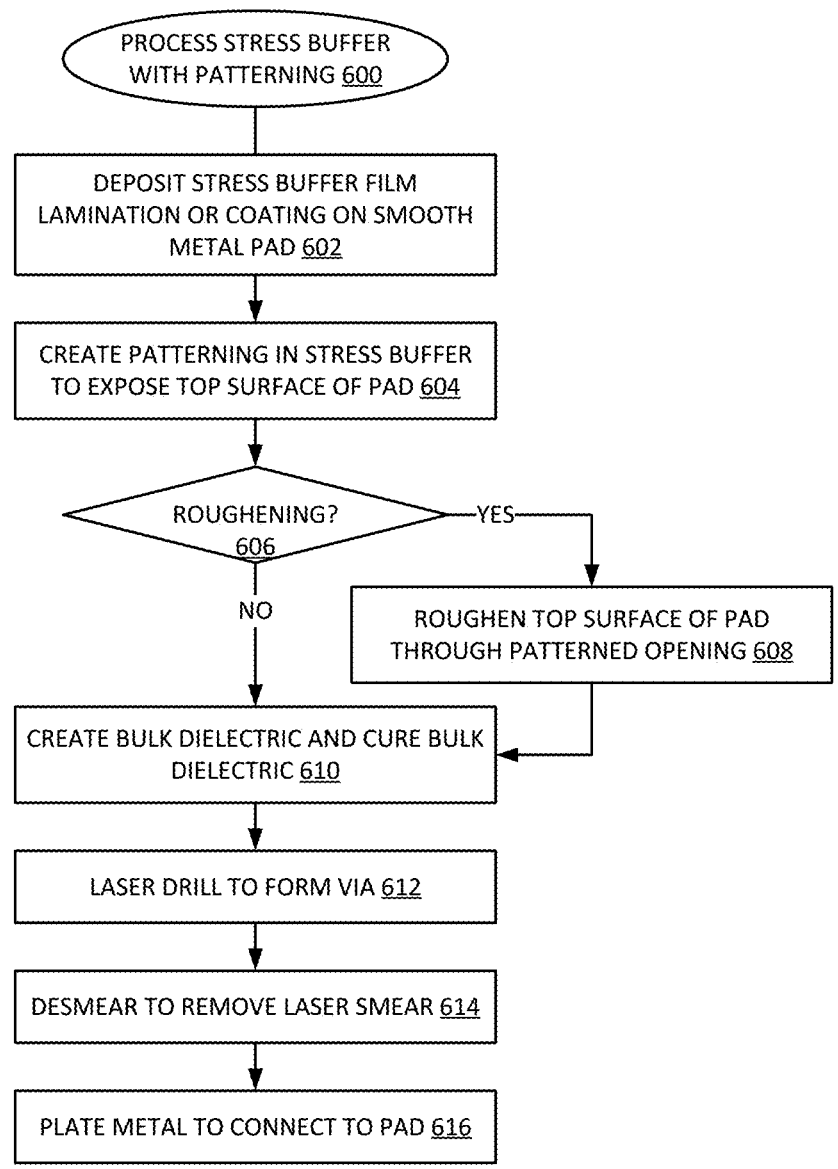
FIG. 6 is a flow diagram of an example of a process for creating an integrated circuit with a stress buffer layer with roughened pad metal.

FIG. 6 is a flow diagram of an example of a process for creating an integrated circuit with a stress buffer layer with roughened pad metal. Process 600 represents a process for creating a stress buffer without patterning in the stress buffer. Process 600 can represent operations of circuit processing in accordance with FIGS. 5A-5F.

In one example, the processing deposits a stress buffer film lamination or coating on a smooth metal pad, at 602. In one example, the processing creates patterning in the stress buffer layer to expose a top surface of the metal pad, at 604. The processing can optionally perform roughening of the exposed surface. If the processing is to perform roughening, at 606 YES branch, in one example, the patterning roughens the top surface of the pad exposed through the patterned opening, at 608.

After optionally roughening the exposed surface, the processing can create a bulk dielectric over the stress buffer film dielectric lamination and cure the bulk dielectric, at 610. If the processing is not to perform roughening, at 606 NO branch, the processing can skip the roughening operations and proceed to creating the bulk dielectric, at 610. In one example, the processing performs a laser drill operation to form a via through the bulk dielectric to expose the surface already exposed through the stress buffer layer patterning, at 612. The processing can desmear to remove laser smear, at 614. The processing can finish the stress buffer processing by plating metal to connect to the pad, at 616. In one example, the plating refers to electroless copper plating to deposit an even layer of metal on the circuit.

Figure 7:
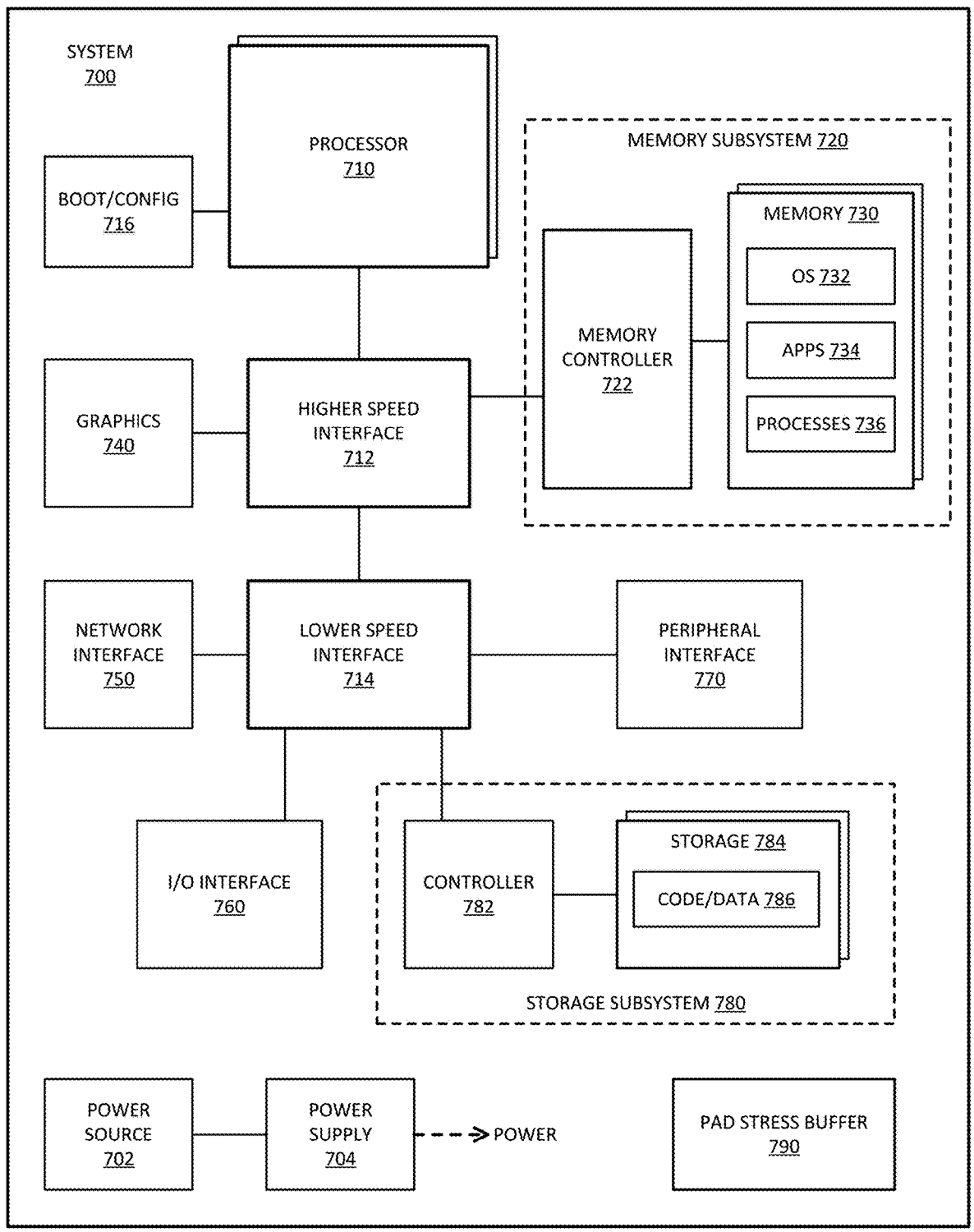
FIG. 7 is a block diagram of an example of a computing system in which an integrated circuit with a stress buffer layer can be implemented.

FIG. 7 is a block diagram of an example of a computing system in which an integrated circuit with a stress buffer layer can be implemented. System 700 represents a computing device in accordance with any example herein, and can be a laptop computer, a desktop computer, a tablet computer, a server, a gaming or entertainment control system, embedded computing device, or other electronic device.

System 700 represents a computer system that includes one or more electronic chips or integrated circuit devices that include pad stress buffer 790. Pad stress buffer 790 represents a stress buffer in accordance with any example herein, with similar electrical properties as the bulk dielectric and mechanical properties that reduce the risk of delamination due to combinations of mechanical stress and thermal cycling. Pad stress buffer 790 can be formed in accordance with any example described.

System 700 includes processor 710 can include any type of microprocessor, central processing unit (CPU), graphics processing unit (GPU), processing core, or other processing hardware, or a combination, to provide processing or execution of instructions for system 700. Processor 710 can be a host processor device. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or a combination of such devices.

System 700 includes boot/config 716, which represents storage to store boot code (e.g., basic input/output system (BIOS)), configuration settings, security hardware (e.g., trusted platform module (TPM)), or other system level hardware that operates outside of a host OS. Boot/config 716 can include a nonvolatile storage device, such as read-only memory (ROM), flash memory, or other memory devices.

In one example, system 700 includes interface 712 coupled to processor 710, which can represent a higher speed interface or a high throughput interface for system components that need higher bandwidth connections, such as memory subsystem 720 or graphics interface components 740. Interface 712 represents an interface circuit, which can be a standalone component or integrated onto a processor die. Interface 712 can be integrated as a circuit onto the processor die or integrated as a component on a system on a chip. Where present, graphics interface 740 interfaces to graphics components for providing a visual display to a user of system 700. Graphics interface 740 can be a standalone component or integrated onto the processor die or system on a chip. In one example, graphics interface 740 can drive a high definition (HD) display or ultra high definition (UHD) display that provides an output to a user. In one example, the display can include a touchscreen display. In one example, graphics interface 740 generates a display based on data stored in memory 730 or based on operations executed by processor 710 or both.

Memory subsystem 720 represents the main memory of system 700, and provides storage for code to be executed by processor 710, or data values to be used in executing a routine. Memory subsystem 720 can include one or more varieties of random-access memory (RAM) such as DRAM, 3DXP (three-dimensional crosspoint), or other memory devices, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710, such as integrated onto the processor die or a system on a chip.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 700 includes interface 714, which can be coupled to interface 712. Interface 714 can be a lower speed interface than interface 712. In one example, interface 714 represents an interface circuit, which can include standalone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can exchange data with a remote device, which can include sending data stored in memory or receiving data to be stored in memory.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, NAND, 3DXP, or optical based disks, or a combination. Storage 784 holds code or instructions and data 786 in a persistent state (i.e., the value is retained despite interruption of power to system 700). Storage 784 can be generically considered to be a "memory," although memory 730 is typically the executing or operating memory to provide instructions to processor 710. Whereas storage 784 is non-volatile, memory 730 can include volatile memory (i.e., the value or state of the data is indeterminate if power is interrupted to system 700). In one example, storage subsystem 780 includes controller 782 to interface with storage 784. In one example controller 782 is a physical part of interface 714 or processor 710, or can include circuits or logic in both processor 710 and interface 714.

Power source 702 provides power to the components of system 700. More specifically, power source 702 typically interfaces to one or multiple power supplies 704 in system 700 to provide power to the components of system 700. In one example, power supply 704 includes an AC to DC (alternating current to direct current) adapter to plug into a wall outlet. Such AC power can be renewable energy (e.g., solar power) power source 702. In one example, power source 702 includes a DC power source, such as an external AC to DC converter. In one example, power source 702 or power supply 704 includes wireless charging hardware to charge via proximity to a charging field. In one example, power source 702 can include an internal battery or fuel cell source.

Figure 8:
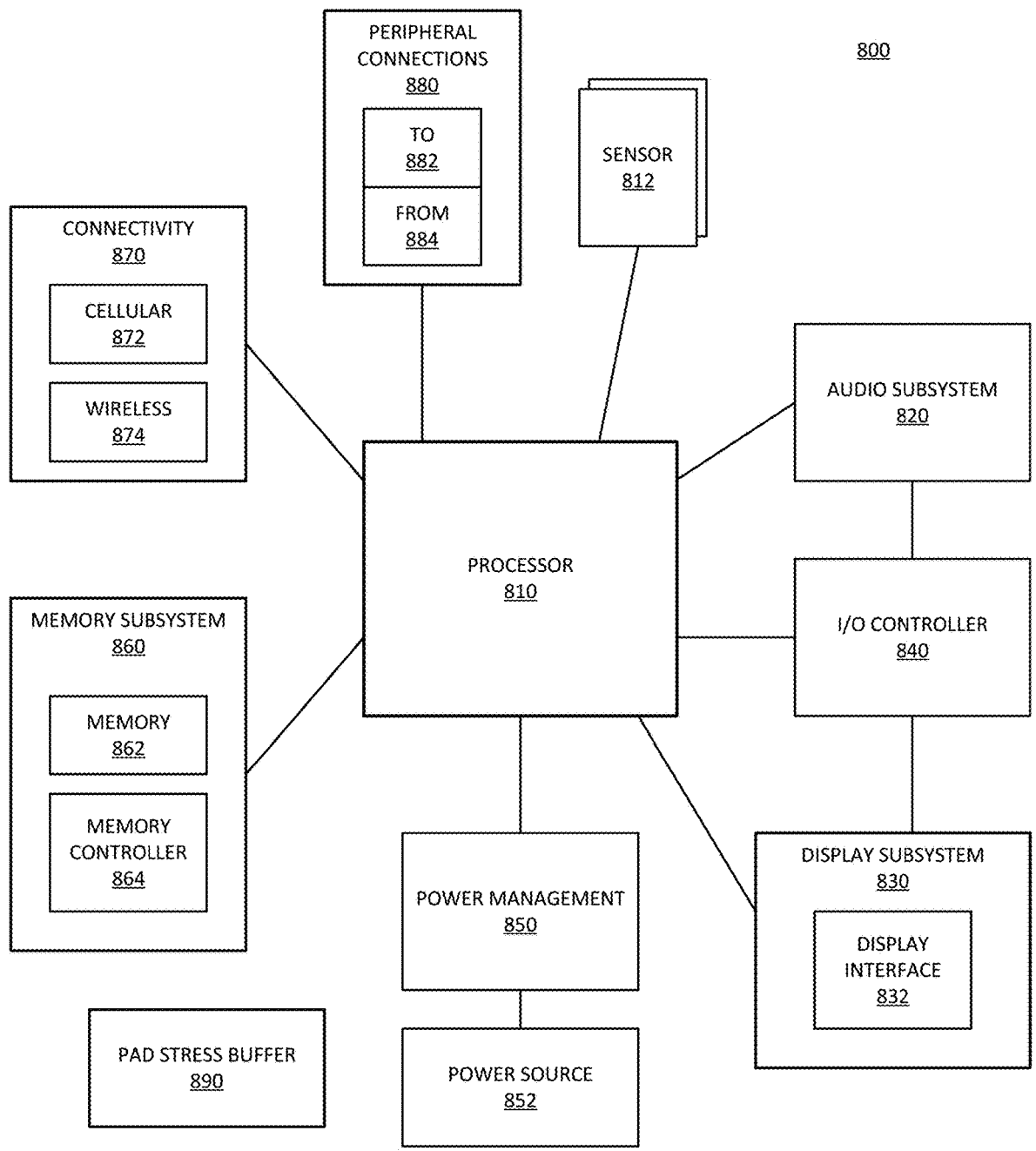
FIG. 8 is a block diagram of an example of a mobile device in which an integrated circuit with a stress buffer layer can be implemented.

FIG. 8 is a block diagram of an example of a mobile device in which an integrated circuit with a stress buffer layer can be implemented. System 800 represents a mobile computing device, such as a computing tablet, a mobile phone or smartphone, wearable computing device, or other mobile device, or an embedded computing device. It will be understood that certain of the components are shown generally, and not all components of such a device are shown in system 800.

System 800 represents a computer system that includes one or more electronic chips or integrated circuit devices that include pad stress buffer 890. Pad stress buffer 890 represents a stress buffer in accordance with any example herein, with similar electrical properties as the bulk dielectric and mechanical properties that reduce the risk of delamination due to combinations of mechanical stress and thermal cycling. Pad stress buffer 890 can be formed in accordance with any example described.

System 800 includes processor 810, which performs the primary processing operations of system 800. Processor 810 can be a host processor device. Processor 810 can include one or more physical devices, such as microprocessors, application processors, microcontrollers, programmable logic devices, or other processing means. The processing operations performed by processor 810 include the execution of an operating platform or operating system on which applications and device functions are executed. The processing operations include operations related to I/O (input/output) with a human user or with other devices, operations related to power management, operations related to connecting system 800 to another device, or a combination. The processing operations can also include operations related to audio I/O, display I/O, or other interfacing, or a combination. Processor 810 can execute data stored in memory. Processor 810 can write or edit data stored in memory.

In one example, system 800 includes one or more sensors 812. Sensors 812 represent embedded sensors or interfaces to external sensors, or a combination. Sensors 812 enable system 800 to monitor or detect one or more conditions of an environment or a device in which system 800 is implemented. Sensors 812 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 812 can also include sensors for biometric systems such as fingerprint recognition systems, face detection or recognition systems, or other systems that detect or recognize user features. Sensors 812 should be understood broadly, and not limiting on the many different types of sensors that could be implemented with system 800. In one example, one or more sensors 812 couples to processor 810 via a frontend circuit integrated with processor 810. In one example, one or more sensors 812 couples to processor 810 via another component of system 800.

In one example, system 800 includes audio subsystem 820, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 800, or connected to system 800. In one example, a user interacts with system 800 by providing audio commands that are received and processed by processor 810.

Display subsystem 830 represents hardware (e.g., display devices) and software components (e.g., drivers) that provide a visual display for presentation to a user. In one example, the display includes tactile components or touchscreen elements for a user to interact with the computing device. Display subsystem 830 includes display interface 832, which includes the particular screen or hardware device used to provide a display to a user. In one example, display interface 832 includes logic separate from processor 810 (such as a graphics processor) to perform at least some processing related to the display. In one example, display subsystem 830 includes a touchscreen device that provides both output and input to a user. In one example, display subsystem 830 includes a high definition (HD) or ultra-high definition (UHD) display that provides an output to a user. In one example, display subsystem includes or drives a touchscreen display. In one example, display subsystem 830 generates display information based on data stored in memory or based on operations executed by processor 810 or both.

I/O controller 840 represents hardware devices and software components related to interaction with a user. I/O controller 840 can operate to manage hardware that is part of audio subsystem 820, or display subsystem 830, or both. Additionally, I/O controller 840 illustrates a connection point for additional devices that connect to system 800 through which a user might interact with the system. For example, devices that can be attached to system 800 might include microphone devices, speaker or stereo systems, video systems or other display device, keyboard or keypad devices, buttons/switches, or other I/O devices for use with specific applications such as card readers or other devices.

As mentioned above, I/O controller 840 can interact with audio subsystem 820 or display subsystem 830 or both. For example, input through a microphone or other audio device can provide input or commands for one or more applications or functions of system 800. Additionally, audio output can be provided instead of or in addition to display output. In another example, if display subsystem includes a touchscreen, the display device also acts as an input device, which can be at least partially managed by I/O controller 840. There can also be additional buttons or switches on system 800 to provide I/O functions managed by I/O controller 840.

In one example, I/O controller 840 manages devices such as accelerometers, cameras, light sensors or other environmental sensors, gyroscopes, global positioning system (GPS), or other hardware that can be included in system 800, or sensors 812. The input can be part of direct user interaction, as well as providing environmental input to the system to influence its operations (such as filtering for noise, adjusting displays for brightness detection, applying a flash for a camera, or other features).

In one example, system 800 includes power management 850 that manages battery power usage, charging of the battery, and features related to power saving operation. Power management 850 manages power from power source 852, which provides power to the components of system 800. In one example, power source 852 includes an AC to DC (alternating current to direct current) adapter to plug into a wall outlet. Such AC power can be renewable energy (e.g., solar power, motion based power). In one example, power source 852 includes only DC power, which can be provided by a DC power source, such as an external AC to DC converter. In one example, power source 852 includes wireless charging hardware to charge via proximity to a charging field. In one example, power source 852 can include an internal battery or fuel cell source.

Memory subsystem 860 includes memory device(s) 862 for storing information in system 800. Memory subsystem 860 can include nonvolatile (state does not change if power to the memory device is interrupted) or volatile (state is indeterminate if power to the memory device is interrupted) memory devices, or a combination. Memory 860 can store application data, user data, music, photos, documents, or other data, as well as system data (whether long-term or temporary) related to the execution of the applications and functions of system 800. In one example, memory subsystem 860 includes memory controller 864 (which could also be considered part of the control of system 800, and could potentially be considered part of processor 810). Memory controller 864 includes a scheduler to generate and issue commands to control access to memory device 862.

Connectivity 870 includes hardware devices (e.g., wireless or wired connectors and communication hardware, or a combination of wired and wireless hardware) and software components (e.g., drivers, protocol stacks) to enable system 800 to communicate with external devices. The external device could be separate devices, such as other computing devices, wireless access points or base stations, as well as peripherals such as headsets, printers, or other devices. In one example, system 800 exchanges data with an external device for storage in memory or for display on a display device. The exchanged data can include data to be stored in memory, or data already stored in memory, to read, write, or edit data.

Connectivity 870 can include multiple different types of connectivity. To generalize, system 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 874 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that system 800 could both be a peripheral device ("to" 882) to other computing devices, as well as have peripheral devices ("from" 884) connected to it. System 800 commonly has a "docking" connector to connect to other computing devices for purposes such as managing (e.g., downloading, uploading, changing, synchronizing) content on system 800. Additionally, a docking connector can allow system 800 to connect to certain peripherals that allow system 800 to control content output, for example, to audiovisual or other systems.

In addition to a proprietary docking connector or other proprietary connection hardware, system 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

Figure 9:
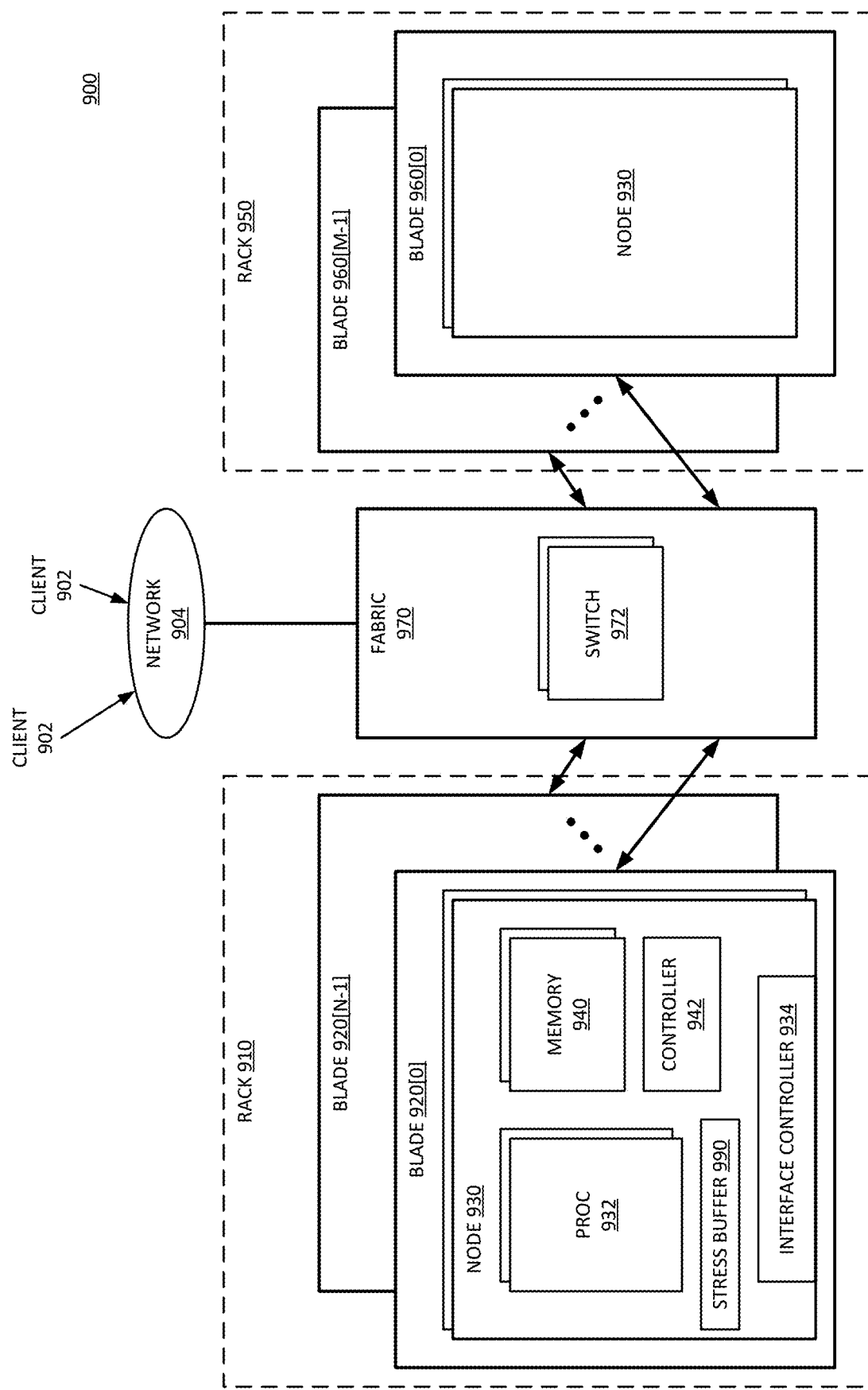
FIG. 9 is a block diagram of an example of a multi-node network in which an integrated circuit with a stress buffer layer can be implemented.

FIG. 9 is a block diagram of an example of a multi-node network in which an integrated circuit with a stress buffer layer can be implemented. System 900 represents a network of nodes that can apply adaptive ECC. In one example, system 900 represents a data center. In one example, system 900 represents a server farm. In one example, system 900 represents a data cloud or a processing cloud.

System 900 includes node 930, which represents a computer system that includes one or more electronic chips or integrated circuit devices that include pad stress buffer 990. Pad stress buffer 990 represents a stress buffer in accordance with any example herein, with similar electrical properties as the bulk dielectric and mechanical properties that reduce the risk of delamination due to combinations of mechanical stress and thermal cycling. Pad stress buffer 990 can be formed in accordance with any example described.

One or more clients 902 make requests over network 904 to system 900. Network 904 represents one or more local networks, or wide area networks, or a combination. Clients 902 can be human or machine clients, which generate requests for the execution of operations by system 900. System 900 executes applications or data computation tasks requested by clients 902.

In one example, system 900 includes one or more racks, which represent structural and interconnect resources to house and interconnect multiple computation nodes. In one example, rack 910 includes multiple nodes 930. In one example, rack 910 hosts multiple blade components 920. Hosting refers to providing power, structural or mechanical support, and interconnection. Blades 920 can refer to computing resources on printed circuit boards (PCBs), where a PCB houses the hardware components for one or more nodes 930. In one example, blades 920 do not include a chassis or housing or other "box" other than that provided by rack 910. In one example, blades 920 include housing with exposed connector to connect into rack 910. In one example, system 900 does not include rack 910, and each blade 920 includes a chassis or housing that can stack or otherwise reside in close proximity to other blades and allow interconnection of nodes 930.

System 900 includes fabric 970, which represents one or more interconnectors for nodes 930. In one example, fabric 970 includes multiple switches 972 or routers or other hardware to route signals among nodes 930. Additionally, fabric 970 can couple system 900 to network 904 for access by clients 902. In addition to routing equipment, fabric 970 can be considered to include the cables or ports or other hardware equipment to couple nodes 930 together. In one example, fabric 970 has one or more associated protocols to manage the routing of signals through system 900. In one example, the protocol or protocols is at least partly dependent on the hardware equipment used in system 900.

As illustrated, rack 910 includes N blades 920. In one example, in addition to rack 910, system 900 includes rack 950. As illustrated, rack 950 includes M blades 960. M is not necessarily the same as N; thus, it will be understood that various different hardware equipment components could be used, and coupled together into system 900 over fabric 970. Blades 960 can be the same or similar to blades 920. Nodes 930 can be any type of node and are not necessarily all the same type of node. System 900 is not limited to being homogenous, nor is it limited to not being homogenous.

For simplicity, only the node in blade 920[0] is illustrated in detail. However, other nodes in system 900 can be the same or similar. At least some nodes 930 are computation nodes, with processor (proc) 932 and memory 940. A computation node refers to a node with processing resources (e.g., one or more processors) that executes an operating system and can receive and process one or more tasks. In one example, at least some nodes 930 are server nodes with a server as processing resources represented by processor 932 and memory 940. A storage server refers to a node with more storage resources than a computation node, and rather than having processors for the execution of tasks, a storage server includes processing resources to manage access to the storage nodes within the storage server.

In one example, node 930 includes interface controller 934, which represents logic to control access by node 930 to fabric 970. The logic can include hardware resources to interconnect to the physical interconnection hardware. The logic can include software or firmware logic to manage the interconnection. In one example, interface controller 934 is or includes a host fabric interface, which can be a fabric interface in accordance with any example described herein.

Processor 932 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory 940 can be or include memory devices and controller 942 controls access to memory 940.

In general with respect to the descriptions herein, in one example, an electronic assembly includes: a metallic contact integrated onto a semiconductor circuit substrate; a bulk organic dielectric over the metallic contact; and an organic stress buffer dielectric layer between the metallic contact and the bulk dielectric, the stress buffer dielectric having higher elongation and lower filler loading with respect to the bulk dielectric.

In one example of the electronic assembly, the metallic contact comprises copper. In accordance with any preceding example of the electronic assembly, in one example, the bulk organic dielectric comprises ABF (Ajinomoto build-up film). In accordance with any preceding example of the electronic assembly, in one example, the organic stress buffer dielectric layer has a df/dk (ratio of dielectric loss factor to dielectric constant) substantially equal to df/dk of the bulk organic dielectric. In accordance with any preceding example of the electronic assembly, in one example, the electronic assembly includes: a via laser drilled through the bulk organic dielectric and the organic stress buffer dielectric to expose a surface of the metallic contact. In accordance with any preceding example of the electronic assembly, in one example, the electronic assembly includes: etched patterning on the bulk organic dielectric created prior to creation of the bulk organic dielectric over the organic stress buffer dielectric, the etched patterning to expose a surface of the metallic contact through the organic stress buffer dielectric. In accordance with any preceding example of the electronic assembly, in one example, the electronic assembly includes: a via laser drilled through the bulk organic dielectric to expose the surface of the metallic contact through the etched patterning. In accordance with any preceding example of the electronic assembly, in one example, the surface exposed through the etch patterning is roughened prior to creation of the bulk organic dielectric over the organic stress buffer dielectric.

In general with respect to the descriptions herein, in one example, a computer system includes: an integrated circuit processed onto a substrate; a metallic contact integrated onto the integrated circuit; a bulk organic dielectric over the metallic contact; an organic stress buffer dielectric layer between the metallic contact and the bulk dielectric, the stress buffer dielectric having higher elongation and lower filler loading with respect to the bulk dielectric; and a trace to connect a package pad to the metallic contact.

In one example of the computer system, the metallic contact comprises copper. In accordance with any preceding example of the computer system, in one example, the bulk organic dielectric comprises ABF (Ajinomoto build-up film). In accordance with any preceding example of the computer system, in one example, the organic stress buffer dielectric layer has a df/dk (ratio of dielectric loss factor to dielectric constant) substantially equal to df/dk of the bulk organic dielectric. In accordance with any preceding example of the computer system, in one example, the computer system includes: a via laser drilled through the bulk organic dielectric and the organic stress buffer dielectric to expose a surface of the metallic contact. In accordance with any preceding example of the computer system, in one example, the computer system includes: etched patterning on the bulk organic dielectric created prior to creation of the bulk organic dielectric over the organic stress buffer dielectric, the etched patterning to expose a surface of the metallic contact through the organic stress buffer dielectric. In accordance with any preceding example of the computer system, in one example, the surface exposed through the etch patterning is roughened prior to creation of the bulk organic dielectric over the organic stress buffer dielectric. In accordance with any preceding example of the computer system, in one example, the computer system includes one or more of: a multicore host processor coupled to the integrated circuit; a display communicatively coupled to a processor; a network interface communicatively coupled to a processor; or a battery to power the computer system.

In general with respect to the descriptions herein, in one example, a method includes: forming a metallic contact on a semiconductor circuit; depositing an organic stress buffer dielectric layer over the metallic contact; and depositing a bulk organic dielectric over the organic stress buffer dielectric and the metallic contact; wherein the organic stress buffer dielectric has higher elongation and lower filler loading with respect to the bulk organic dielectric.

In one example of the method, depositing the organic stress buffer dielectric layer comprises forming a layer of dielectric having a df/dk (ratio of dielectric loss factor to dielectric constant) substantially equal to df/dk of the bulk organic dielectric. In accordance with any preceding example of the method, in one example, the method includes: patterning the organic stress buffer dielectric prior to creating the bulk organic dielectric over the organic stress buffer dielectric, the patterning to expose a surface of the metallic contact through the organic stress buffer dielectric. In accordance with any preceding example of the method, in one example, the method includes: laser drilling a via through the bulk organic dielectric to expose the surface of the metallic contact. In accordance with any preceding example of the method, in one example, the method includes: roughening the surface of the metallic contact prior to creating the bulk organic dielectric over the organic stress buffer dielectric.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. An electronic assembly, comprising:
    a metallic contact integrated onto a semiconductor circuit substrate;
    a bulk organic dielectric over the metallic contact; and
    a layer of an organic stress buffer dielectric between the metallic contact and the bulk organic dielectric, the organic stress buffer dielectric having higher elongation with respect to the bulk organic dielectric, wherein the organic stress buffer dielectric has a lower content of filler with smaller filler size with respect to filler content and size of the bulk organic dielectric.

2. The electronic assembly of claim 1, wherein the metallic contact comprises copper.

3. The electronic assembly of claim 1, wherein the organic stress buffer dielectric is a different organic material from the bulk organic dielectric, and wherein the bulk organic dielectric comprises ABF (Ajinomoto build-up film).

4. The electronic assembly of claim 1, wherein the layer of the organic stress buffer dielectric has a df/dk (ratio of dielectric loss factor to dielectric constant) substantially equal to df/dk of the bulk organic dielectric.

5. The electronic assembly of claim 1, further comprising:
    a via laser drilled through the bulk organic dielectric and the organic stress buffer dielectric to expose a surface of the metallic contact.

6. The electronic assembly of claim 1, further comprising:
    etched patterning on the bulk organic dielectric created prior to creation of the bulk organic dielectric over the organic stress buffer dielectric, the etched patterning to expose a surface of the metallic contact through the organic stress buffer dielectric.

7. The electronic assembly of claim 6, further comprising:
    a via laser drilled through the bulk organic dielectric to expose the surface of the metallic contact through the etched patterning.

8. The electronic assembly of claim 6, wherein the surface exposed through the etch patterning is roughened prior to creation of the bulk organic dielectric over the organic stress buffer dielectric.

9. A computer system, comprising:
    an integrated circuit processed onto a substrate;
    a metallic contact integrated onto the integrated circuit;
    a bulk organic dielectric over the metallic contact;
    a layer of an organic stress buffer dielectric between the metallic contact and the bulk organic dielectric, the organic stress buffer dielectric having higher elongation with respect to the bulk organic dielectric, wherein the organic stress buffer dielectric has a lower content of filler with smaller filler size with respect to filler content and size of the bulk organic dielectric; and a trace to connect a package pad to the metallic contact.

10. The computer system of claim 9, wherein the metallic contact comprises copper.

11. The computer system of claim 9, wherein the organic stress buffer dielectric is a different organic material from the bulk organic dielectric, and wherein the bulk organic dielectric comprises ABF (Ajinomoto build-up film).

12. The computer system of claim 9, wherein the layer of the organic stress buffer dielectric has a df/dk (ratio of dielectric loss factor to dielectric constant) substantially equal to df/dk of the bulk organic dielectric.

13. The computer system of claim 9, further comprising:

a via laser drilled through the bulk organic dielectric and the organic stress buffer dielectric to expose a surface of the metallic contact.

14. The computer system of claim 9, further comprising:

etched patterning on the bulk organic dielectric created prior to creation of the bulk organic dielectric over the organic stress buffer dielectric, the etched patterning to expose a surface of the metallic contact through the organic stress buffer dielectric.

15. The computer system of claim 14, wherein the surface exposed through the etch patterning is roughened prior to creation of the bulk organic dielectric over the organic stress buffer dielectric.

16. The computer system of claim 9, further comprising one or more of:

a multicore host processor coupled to the integrated circuit;

a display communicatively coupled to a processor;

a network interface communicatively coupled to a processor; or a battery to power the computer system.

* * * * *